US012308621B2

(12) United States Patent
Leicht et al.

(10) Patent No.: US 12,308,621 B2
(45) Date of Patent: May 20, 2025

(54) POWER DISTRIBUTION ENCLOSURE HAVING A COMBINED RECONFIGURABLE SERVICE ENTRANCE AND A DC DISTRIBUTION SECTION

(71) Applicant: AcLeap Power Inc., Taipei (TW)

(72) Inventors: Keith Leicht, Sachse, TX (US); Charles Higby, Lewisville, TX (US); Roy Jaescentt Davis, Rowlett, TX (US); Paul Ng, Dallas, TX (US)

(73) Assignee: AcLeap Power Inc., Taipei (TW)

( * ) Notice: Subject to any disclaimer, the term of this patent is extended or adjusted under 35 U.S.C. 154(b) by 165 days.

(21) Appl. No.: 17/828,724

(22) Filed: May 31, 2022

(65) Prior Publication Data

US 2023/0402823 A1    Dec. 14, 2023

(51) Int. Cl.
*H02B 1/42* (2006.01)
*G08B 21/18* (2006.01)
*H02J 5/00* (2016.01)
*H02M 7/00* (2006.01)
*H05K 5/00* (2025.01)

(52) U.S. Cl.
CPC ............. *H02B 1/42* (2013.01); *G08B 21/18* (2013.01); *H02J 5/00* (2013.01); *H02M 7/003* (2013.01); *H05K 5/00* (2013.01)

(58) Field of Classification Search
CPC ... H02B 1/30; H02B 1/40; H02B 1/42; G08B 21/18; H02M 7/003; H05K 5/00; H02J 5/00

See application file for complete search history.

(56) References Cited

U.S. PATENT DOCUMENTS

| 5,712,779 | A | * | 1/1998 | Sheppard | H04M 19/00 363/69 |
|---|---|---|---|---|---|
| 7,983,797 | B2 | | 7/2011 | Rasmussen et al. | |
| 8,514,551 | B2 | | 8/2013 | Cosley et al. | |
| 9,007,745 | B1 | * | 4/2015 | Flegel | H02B 1/16 361/627 |
| 9,377,832 | B1 | * | 6/2016 | Heydari Monfared | G06F 1/263 |
| 9,991,697 | B1 | * | 6/2018 | Howard | H01H 37/74 |
| 10,615,605 | B2 | | 4/2020 | Gudgel et al. | |
| 10,862,277 | B1 | | 12/2020 | Garrasi | |
| 2010/0290605 | A1 | * | 11/2010 | Wright | H05K 7/20945 379/102.04 |
| 2015/0316944 | A1 | | 11/2015 | Thellend | |

(Continued)

*Primary Examiner* — Zachary Pape
(74) *Attorney, Agent, or Firm* — McCarter & English, LLP

(57) ABSTRACT

In one aspect, a power distribution enclosure is provided to supply DC power to a customer. The power distribution enclosure comprises an AC input section, a DC output section, a reconfigurable service entrance, a power converter section, and a DC distribution section. The AC input section is configured to receive AC power. The DC output section is configured to distribute the DC power to the customer. The reconfigurable service entrance is electrically coupled to the AC input section. The power converter section is electrically coupled to the AC input section and is configured to receive the AC power from the reconfigurable service entrance, and to generate the DC power. The DC distribution section is electrically coupled to the power converter section and is configured to receive the DC power from the power converter section, and to distribute the DC power to the DC output section.

20 Claims, 12 Drawing Sheets

(56) References Cited

U.S. PATENT DOCUMENTS

2019/0103761 A1* 4/2019 Wyma ................. H02J 9/061
2023/0345681 A1* 10/2023 Sinopoli ............ H05K 7/20909

* cited by examiner

POWER DISTRIBUTION ENCLOSURE HAVING A COMBINED RECONFIGURABLE SERVICE ENTRANCE AND A DC DISTRIBUTION SECTION

BACKGROUND

The field of the disclosure relates to utility power distribution systems, and more particularly, to enclosures for power rectification and distribution.

When a utility customer has a direct current (DC) power requirement, the utility will often install and wire an alternating current (AC) service entrance enclosure and a power meter to the utility AC service distribution, with the output of the AC service entrance enclosure wired to an AC-DC converter enclosure that converts the AC to DC for the customer's equipment. However, the use of two separate enclosures may increase the amount of space used to provide the power converting solution, which can be problematic when the AC service entrance enclosure and the DC converter enclosure are in environments where space is limited. Thus, it is desirable to more efficiently utilize the limited space that may available when a utility customer has a DC power requirement.

BRIEF DESCRIPTION

In one aspect, a power distribution enclosure is provided. The power distribution enclosure is configured to supply DC power to a customer. The power distribution enclosure comprises an AC input section, a DC output section, a reconfigurable service entrance, a power converter section, and a DC distribution section. The AC input section is configured to receive AC power. The DC output section is configured to distribute the DC power to the customer. The reconfigurable service entrance is electrically coupled to the AC input section. The power converter section is electrically coupled to the AC input section and is configured to receive the AC power from the reconfigurable service entrance, and to generate the DC power. The DC distribution section is electrically coupled to the power converter section and is configured to receive the DC power from the power converter section, and to distribute the DC power to the DC output section.

In another aspect, a method of installing a power distribution enclosure to supply DC power to a customer is provided. The method comprises mounting the power distribution enclosure and connecting AC wiring to an AC input section of the power distribution enclosure, where the AC input section is electrically coupled to a reconfigurable service entrance. The method further comprises connecting DC wiring to a DC output section of the power distribution enclosure, wherein the DC wiring supplies the DC power to the customer via a power converter section that converts AC power supplied to the AC input section to the DC power. The method further comprises configuring the reconfigurable service entrance based on whether the power distribution enclosure is a service entrance for a utility.

In another aspect, a power distribution enclosure is provided. The power distribution enclosure is configured to supply DC power to a customer. The power distribution enclosure comprises an AC input section, a DC output section, a reconfigurable service entrance, a power converter section, and a DC distribution section. The AC input section is configured to receive AC power. The DC output section is configured to distribute the DC power to the customer. The reconfigurable service entrance is electrically coupled to the AC input section. The reconfigurable service entrance comprises a ground connector electrically coupled to the power distribution enclosure, and an isolated neutral bus assembly electrically isolated from the power distribution enclosure, where the reconfigurable service entrance comprises a service entrance when the isolated neutral bus assembly is bonded to the ground connector. The reconfigurable service entrance further comprises an AC mains breaker electrically coupled to the AC input section. The power converter section is electrically coupled to the AC mains breaker and is configured to receive the AC power, and to generate the DC power. The DC distribution section is electrically coupled to the power converter section and is configured to receive the DC power from the power converter section, and to distribute the DC power to the DC output section.

DRAWINGS

These and other features, aspects, and advantages of the present disclosure will become better understood when the following detailed description is read with reference to the accompanying drawings in which like characters represent like parts throughout the drawings, wherein.

Figure 1:
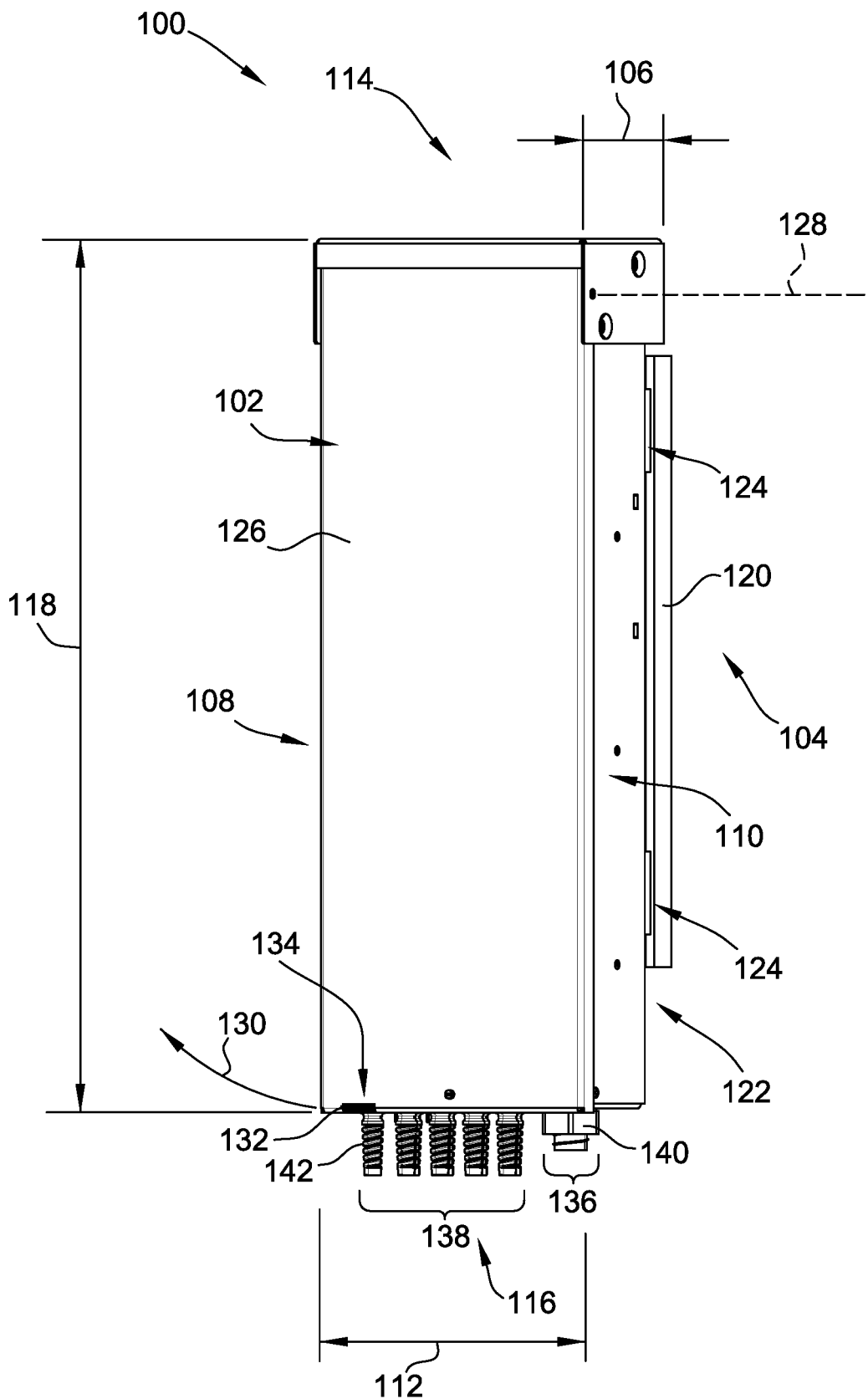
FIG. 1 depicts a front perspective view of a power distribution enclosure in an exemplary embodiment.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As discussed briefly above, when a commercial customer has a DC power requirement for equipment, the utility may mount a service entrance enclosure, a power meter, and an AC-DC converter enclosure near the customer's equipment. The utility may run AC wiring from the AC distribution to the power meter, and then run AC wiring from the power meter to an AC mains breaker at service entrance enclosure. From the AC service entrance enclosure, the utility may run AC wiring from the AC mains breaker to the AC-DC converter enclosure. The AC/DC converter enclosure includes AC breakers, DC breakers (or fuses), and one or more AC/DC converters, which convert the AC service to DC for the customer. DC wiring is then run from the output of the AC-DC converter enclosure to the customer's equipment.

The use of two separate enclosures, each with their own specialized AC and DC circuit breakers, design considerations, and regulatory oversight, is an inefficient use of space when rectifiers are needed for a commercial customer's equipment.

In the embodiments described herein, a power distribution enclosure is provided that combines both a reconfigurable service entrance and one or more AC-DC converters in a common enclosure that, in some embodiments, mounts to a utility pole. In other embodiments, the power distribution enclosure mounts to other locations, such as a wall. The power distribution enclosure, in some embodiments, integrates various components including one or more AC-DC converters, a battery backup (or another storage device, which may be internal to the enclosure or external to the enclosure), an AC mains breaker, one or more output DC breakers (or fuses), AC and/or DC surge protection devices, and customer alarms. In addition, the various components may be modular in design to simplify the servicing of the power distribution enclosure. For example, the design of the power distribution enclosure may enable replacement of the various components (e.g., the AC/DC converter(s)) without removing the power distribution enclosure from the mounting location, which simplifies and reduces the costs associated with in-field repair operations. Further, the use of a single power distribution enclosure, which includes both the rectifier and the AC service entrance (if so configured), reduces the amount of space used for the solution. Further, the use of a single power distribution enclosure eliminates the separate AC conduit that normally runs from the service entrance enclosure to the AC/DC converter enclosure.

FIG. 1 depicts a front perspective view of a power distribution enclosure 100 in an exemplary embodiment. In this embodiment, enclosure 100 comprises a front portion 102 and a rear portion 104 that opposes front portion 102, and are spaced apart from each other by depth 106 of enclosure 100. When enclosure 100 is mounted to a mounting location, such as a utility pole (or a wall), front portion 102 faces away from the mounting location and rear portion 104 faces towards the mounting location. In this embodiment, enclosure 100 further comprises side portions 108, 110 that oppose each other, and are spaced apart by a width 112 of enclosure 100. Enclosure 100 further comprises a top portion 114, and a bottom portion 116 that oppose each other, and are spaced apart by a length 118 of enclosure 100.

In this embodiment, enclosure 100 further comprises a mounting portion 120 disposed along a rear face 122 of enclosure 100, and mounting features 124. In this embodiment, mounting features 124 are formed from a gap between mounting portion 120 and rear face 122 of enclosure 100. When mounting enclosure 100 to a utility pole, straps are fed through mounting features 124 in the gap between rear face 122 of enclosure 100 and mounting portion 120, and the straps are wrapped around the utility pole and secured in place. As a result, enclosure 100 is secured to the utility pole. In other embodiments, mounting features 124 include any component, system, or device which secures enclosure 100 to a utility pole or some other surface, such as a wall.

Figure 2:
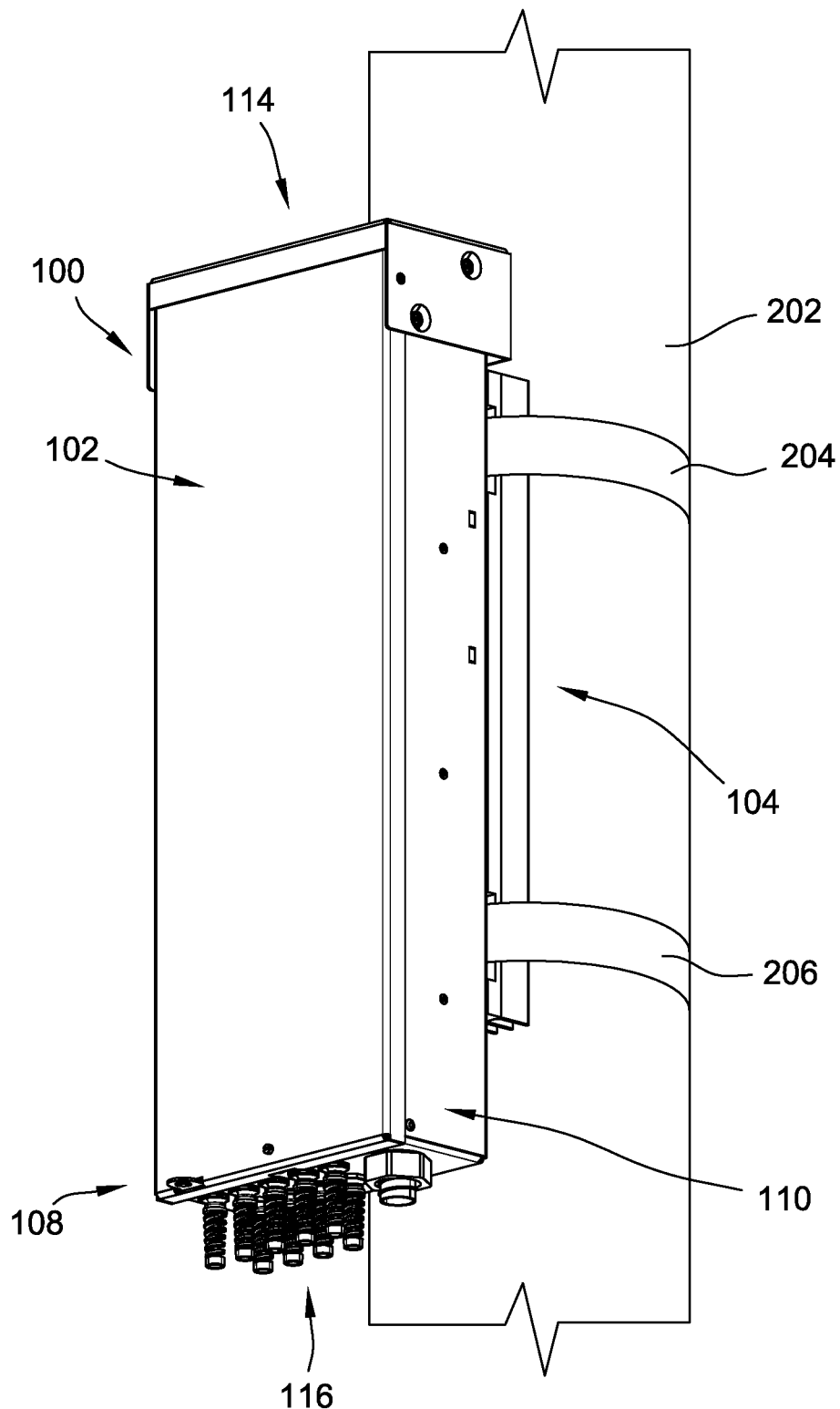
FIG. 2 depicts the enclosure of FIG. 1 mounted to a utility pole in an exemplary embodiment.

FIG. 2 depicts enclosure 100 mounted to a utility pole 202 via straps 204, 206 in an exemplary embodiment. When enclosure 100 is mounted to utility pole 202 or some other service location, enclosure 100 extends vertically in the orientation depicted in FIG. 2, with top portion 114 disposed at a greater height above the ground on utility pole 202 than bottom portion 116.

Referring again to FIG. 1, front portion 102 of enclosure 100 in this embodiment further comprises a front cover 126, which pivots on an axis 128 in the direction of an arrow 130 in order to enable access to the internal components of enclosure 100. In this embodiment, front cover 126 is secured in place via a retainer 132 that extends through an opening 134 in front cover 126, although front cover 126 may be secured in place using other features, not shown or described. Bottom portion 116 in this embodiment includes input and output areas for AC and DC wiring. In particular, bottom portion 116 of enclosure 100 includes an AC input section 136 that is used to wire enclosure 100 to the utility AC service (e.g., via a meter) or wire enclosure 100 to AC wiring supplied from the customer. Enclosure 100 further includes a DC output section 138 that is used to wire enclosure 100 to the customer's equipment. In this embodiment, AC input section 136 includes a conduit coupler 140, which provides a water-resistant connection to enclosure 100 for AC wiring that is run within conduit, and DC output section 138 includes one or more rubber grommets 142, which provide a water-resistant connection to enclosure 100 for the DC wiring from enclosure 100 to the customer's equipment.

Figure 3:
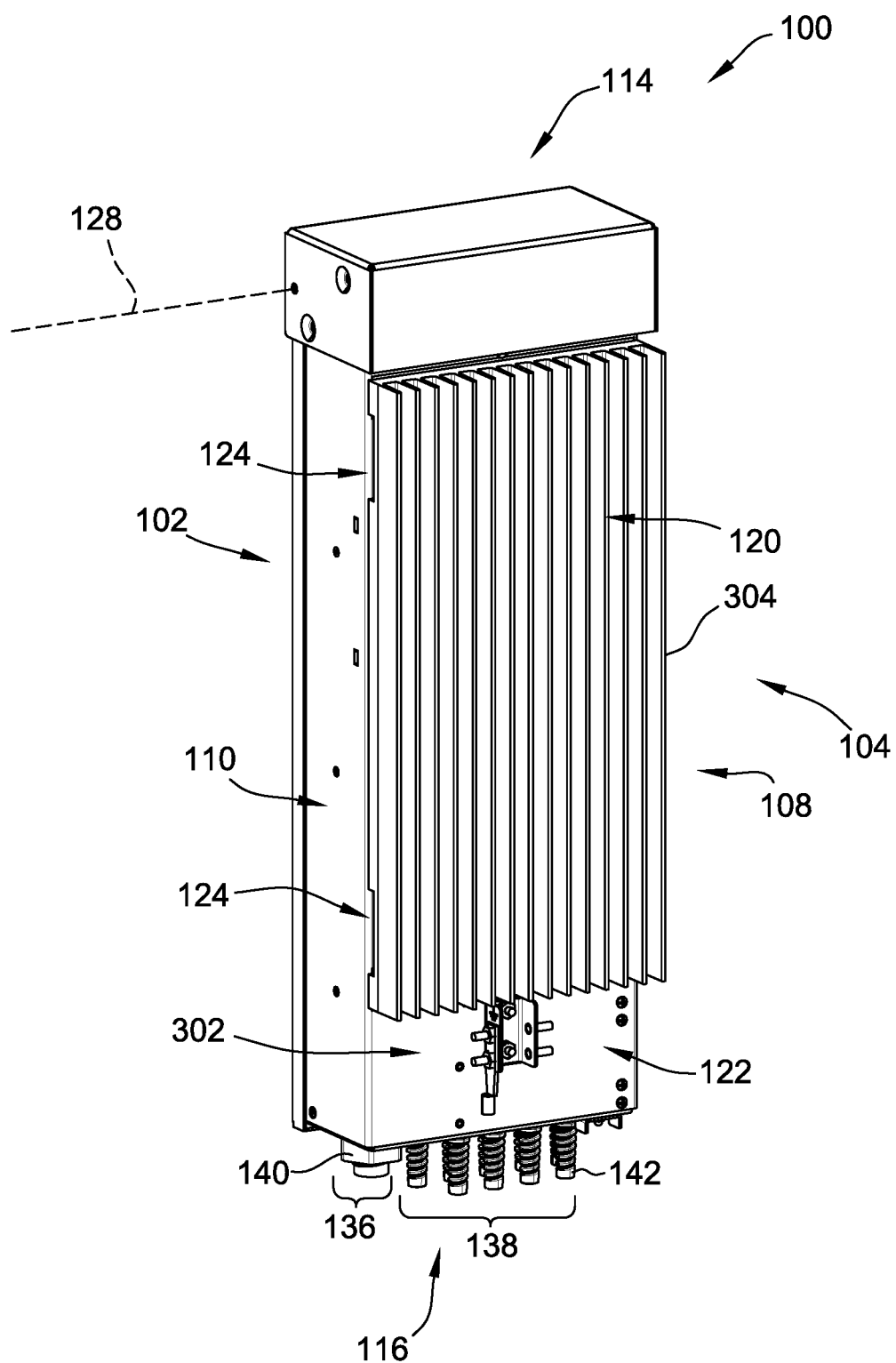
FIG. 3 depicts a rear perspective view of the enclosure of FIG. 1 in an exemplary embodiment.

FIG. 3 depicts a rear perspective view of enclosure 100 in an exemplary embodiment. In this embodiment, enclosure 100 further includes a chassis ground connection point 302. Chassis ground connection point 302 is used to ground enclosure 100 to earth. In this embodiment, mounting portion 120 includes fins 304, which are used for heat dissipation. In some embodiments, fins 304 are formed in the shape of a saddle, which allows enclosure 100 to fit around the partial circumference of utility pole 202. In other embodiments, fins 304 are omitted from mounting portion 120.

Figure 4:
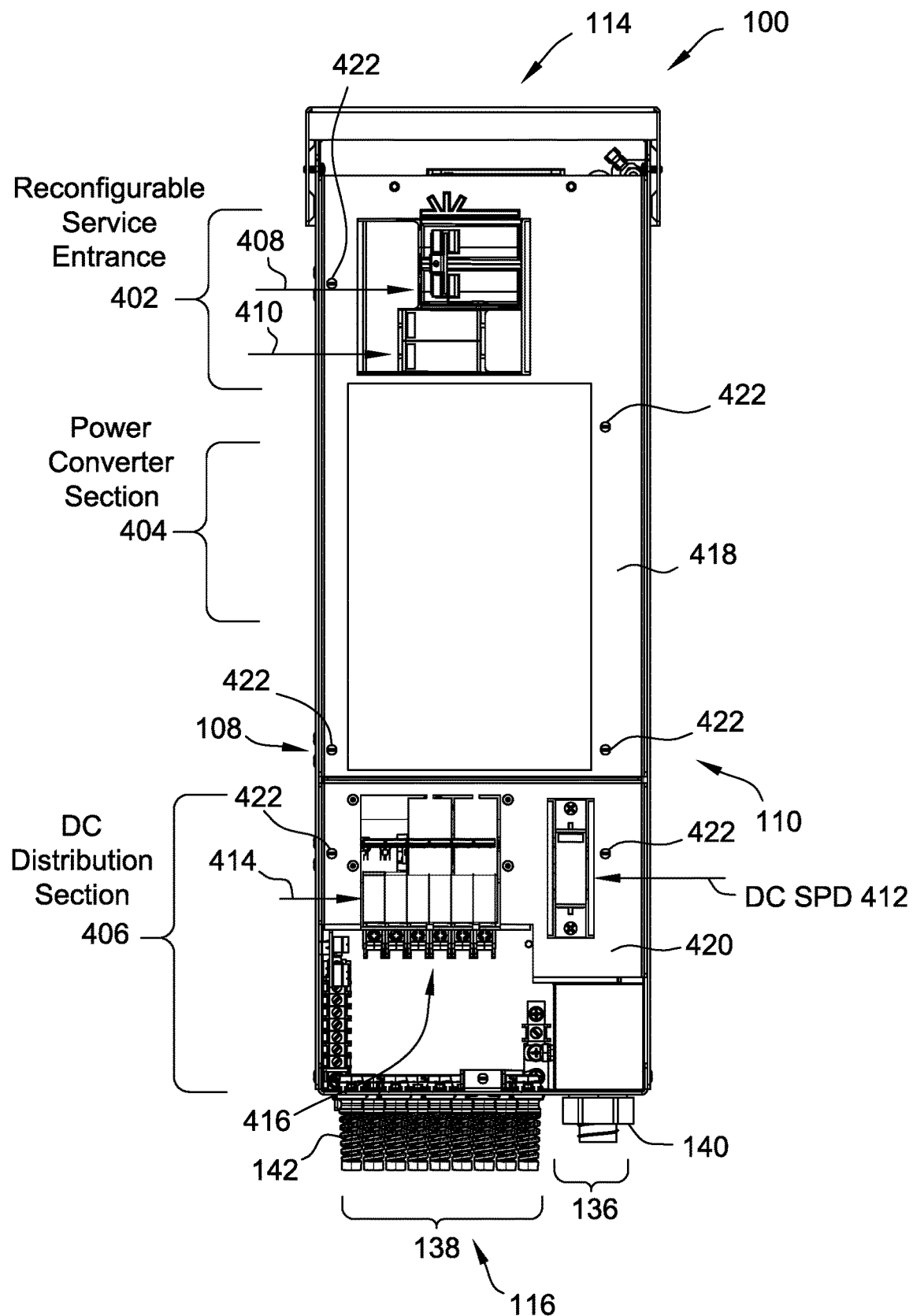
FIG. 4 depicts the enclosure of FIG. 1 with a front cover removed in an exemplary embodiment.

FIG. 4 depicts enclosure 100 of FIG. 1 with front cover 126 removed in an exemplary embodiment. In this embodiment, enclosure 100 further comprises a reconfigurable service entrance 402, a power converter section 404, and a DC distribution section 406. Reconfigurable service entrance 402 in this embodiment comprises an AC mains breaker 408 and an AC surge protection device (SPD) 410. In this embodiment, AC mains breaker 408 is depicted as two pole device. AC mains breaker 408 forms the main AC disconnect for enclosure 100 from the AC power supplied to enclosure 100. AC mains breaker 408 provides, for example, a 22 kilo-Amp (kA) short-circuit current rating, with a 20 A trip rating. The downstream side of AC mains breaker 408 is supplied to AC SPD 410, which provides AC surge protection to enclosure 100 from the AC power supplied to enclosure 100. AC SPD 410 then feeds power converter section 404.

DC distribution section 406 in this embodiment further includes a DC surge protection device (SPD) 412, and DC breakers 414. The output of power converter section 404 is fed to DC SDP 412, which then feeds DC breakers 414. The number of DC breakers 414 is illustrative only, and enclosure 100 may include fewer or more DC breakers 414 in other embodiments. DC breakers 414 include DC terminal connections 416, which are used to connect DC wiring to enclosure 100, with the DC wiring entering enclosure 100 through rubber grommets 142. DC distribution section 406 may, for example, supply forty-eight Volts DC for the customer's equipment.

In this embodiment, enclosure 100 includes an AC dead front panel 418 and a DC dead front panel 420, each of which can be removed during service operations (e.g., by removing screws 422) to provide access to the various internal components of enclosure 100, including the AC/DC converter(s), which are not visible in FIG. 4.

Figure 5:
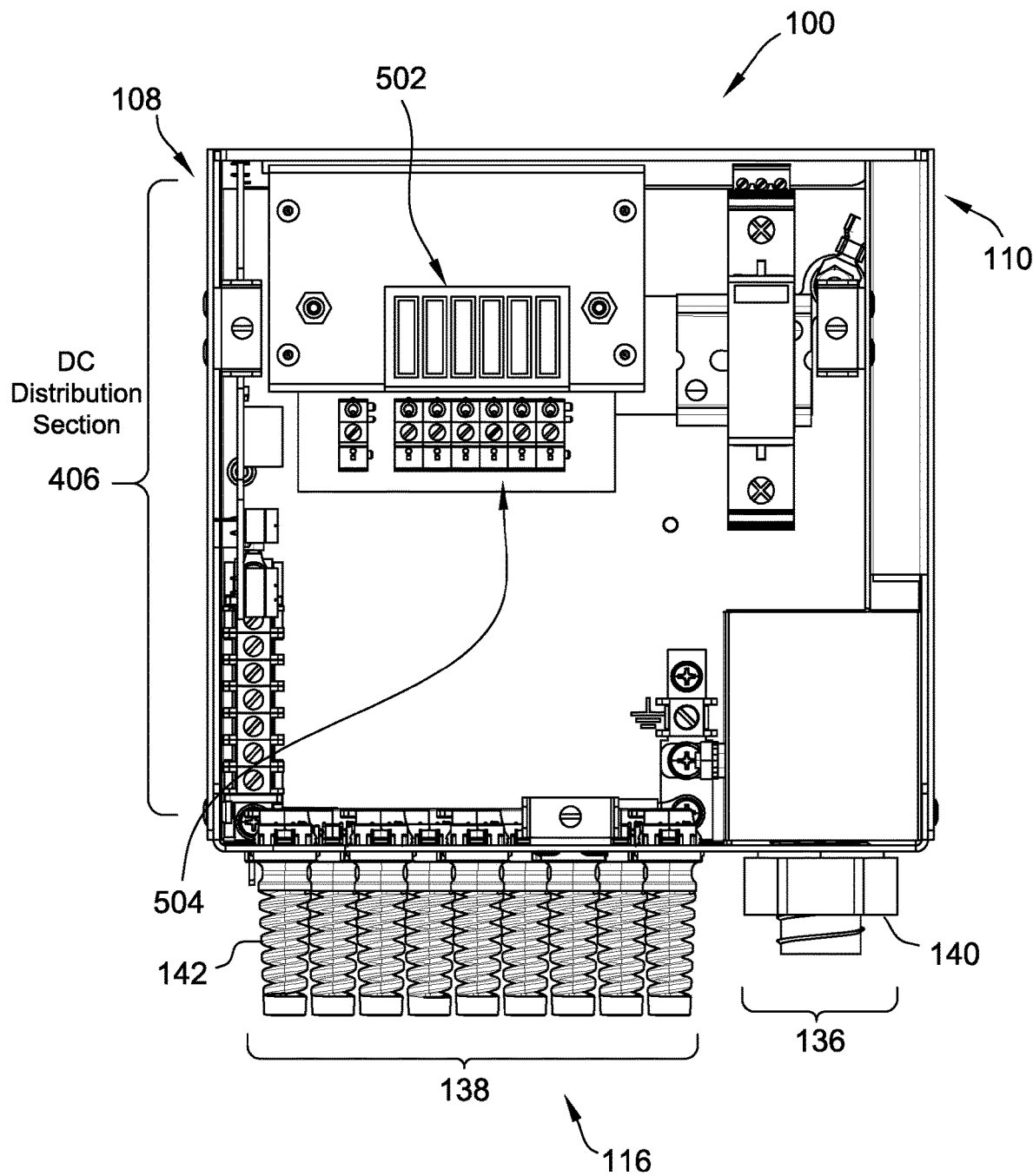
FIG. 5 depicts a portion of the enclosure of FIG. 4 in an exemplary embodiment.

In some embodiments, DC distribution section 406 utilizes fuses instead of DC breakers 414. FIG. 5 depicts DC distribution section 406 in another exemplary embodiment. In this embodiment, DC distribution section 406 utilizes DC fuses 502 instead of circuit breakers. DC fuses 502 in this embodiment are coupled to a DC terminal block 504. DC terminal block 504 may be used to connect DC wiring to enclosure 100, with the DC wiring entering enclosure 100 through rubber grommets 142.

Figure 6:
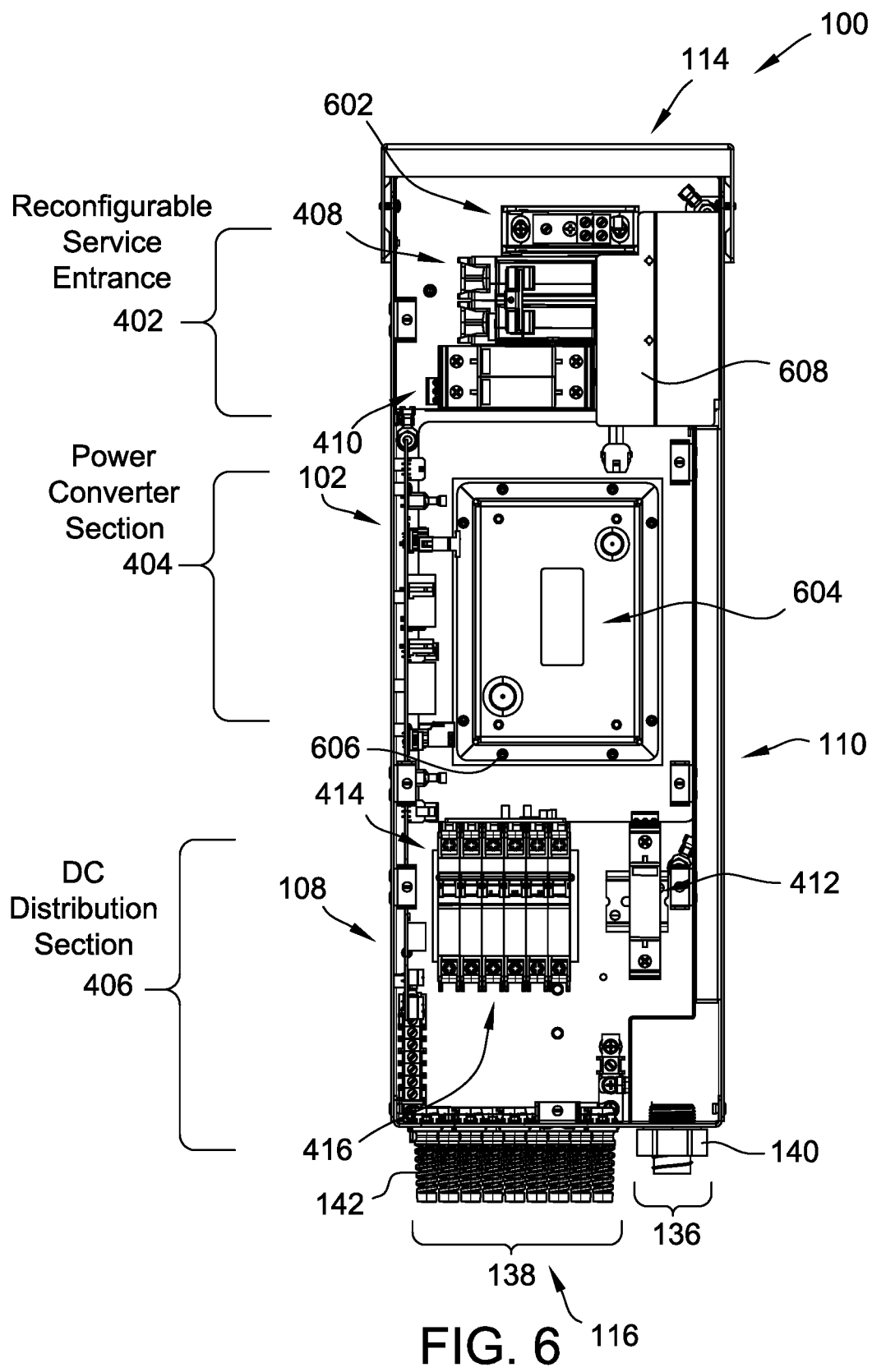
FIG. 6 depicts the enclosure of FIG. 4 with dead front panels removed in an exemplary embodiment.

FIG. 6 depicts enclosure 100 of FIG. 4 with AC dead font panel 418 and DC dead front panel 420 removed in an exemplary embodiment. Reconfigurable service entrance 402 in this embodiment further includes an isolated neutral bus assembly 602, which will be discussed in more detail below. Power converter section 404 in this embodiment further comprises an AC/DC converter module 604, which receives AC from AC mains breaker 408, and supplies DC to DC breakers 414 (or DC fuses 502, in embodiments where DC breakers 414 are replaced with DC fuses 502).

Although only one AC/DC converter is illustrated in FIG. 5, power converter section 404 may include additional AC/DC converters in other embodiments. For example, power converter section 404 may include two or more AC/DC converters coupled in parallel in high-power applications and/or may include additional AC/DC converters for redundancy (e.g., one AC/DC converter operates in standby in case a main AC/DC converter fails). In this embodiment, AC/DC converter module 604 is removable from enclosure 100 (e.g., via screws 606) without removing enclosure 100 from utility pole 202 or a wall, which enables enclosure 100 to be more easily serviced by a field technician. In this embodiment, reconfigurable service entrance 402 further includes an insulated cover 608, which protects the technician from live AC wires (not shown) that are coupled to AC mains breaker 408.

Figure 7:
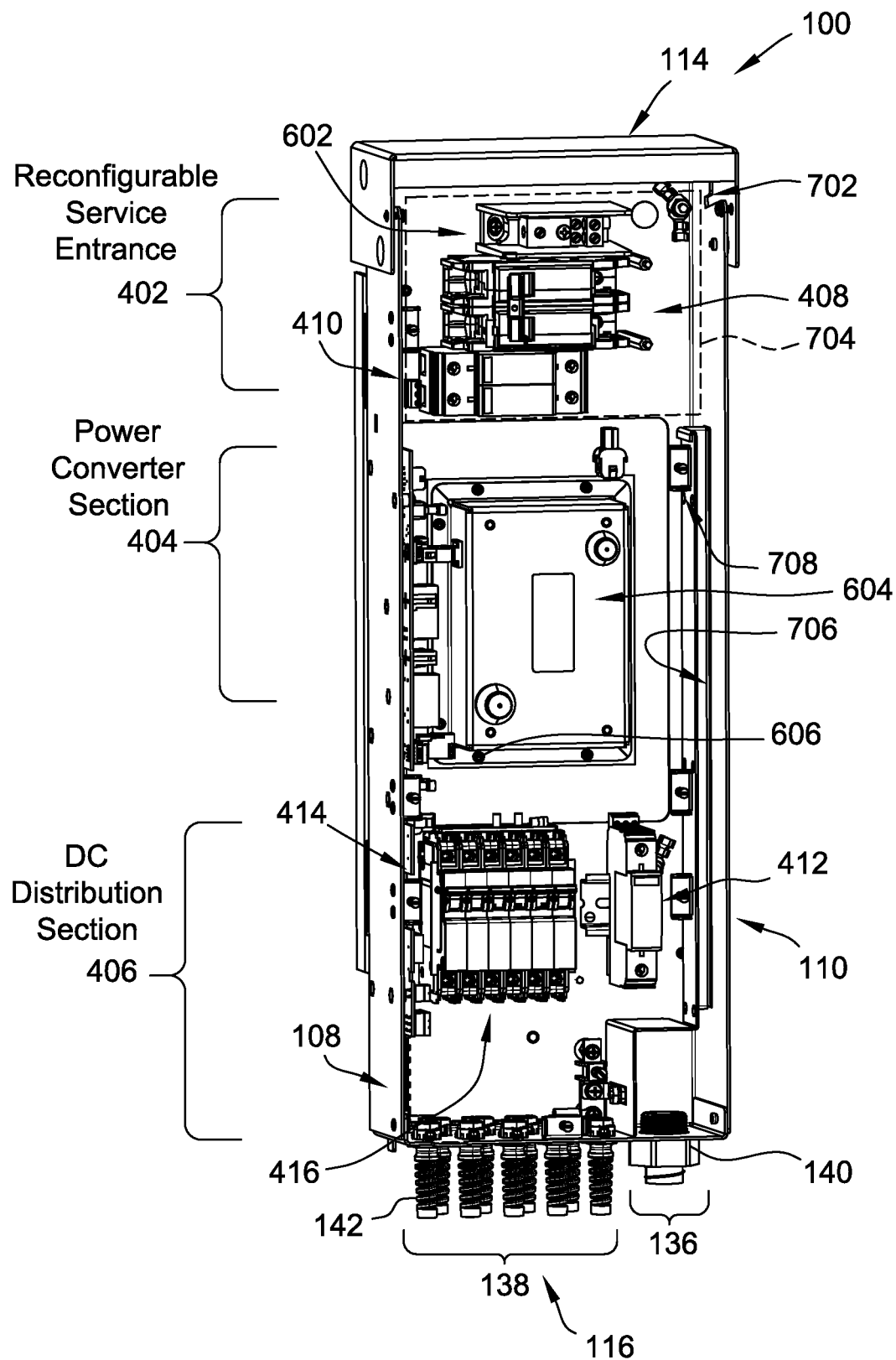
FIG. 7 depicts the enclosure of FIG. 6 with an insulated cover removed in an exemplary embodiment.

FIG. 7 depicts enclosure 100 of FIG. 6 with insulated cover 608 removed in an exemplary embodiment. In this embodiment, reconfigurable service entrance 402 further comprises a grounding connector 702. In this embodiment, isolated neutral bus assembly 602 is electrically isolated from enclosure 100, and grounding connector 702 is electrically coupled to enclosure 100. Isolated neutral bus assembly 602 and grounding connector 702 provide the ability to selectively reconfigure enclosure 100 as a service entrance as desired (e.g., based on how isolated neutral bus assembly 602 and grounding connector 702 are wired). For example, when enclosure 100 is configured as a service entrance, L1, L2 wiring is connected to AC mains breaker 408, and a neutral wire is electrically connected to isolated neutral bus assembly 602. In addition, a bond jumper is connected from isolated neutral bus assembly 602 to grounding connector 702, which configures enclosure 100 as a service entrance. In this embodiment, a volume 704 of reconfigurable service entrance 402 is configured to accommodate a 22-kA short circuit regulatory requirement for service entrances.

Figure 8:
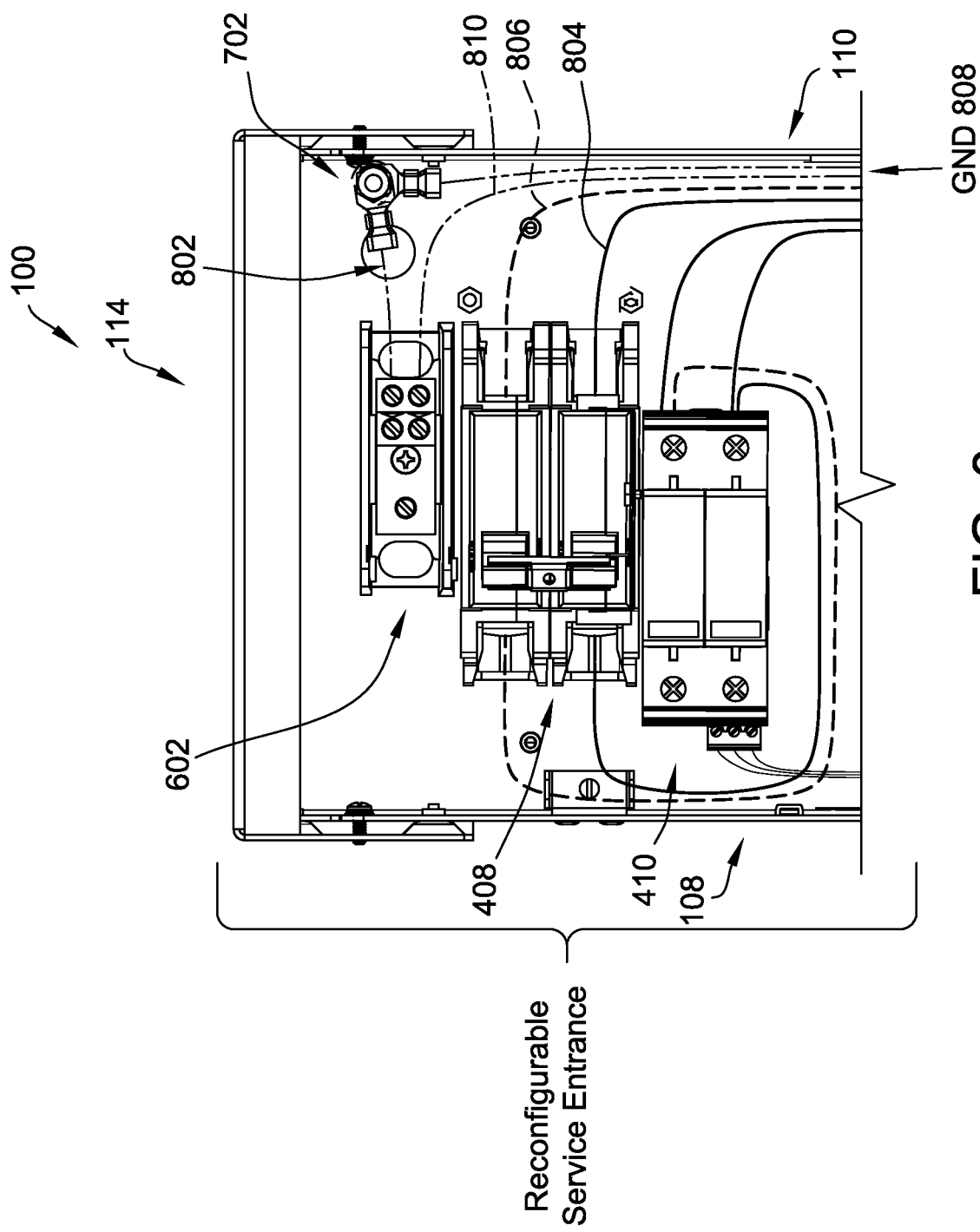
FIG. 8 depicts a portion of the enclosure of FIG. 7 when the enclosure is configured as a service entrance in an exemplary embodiment.

FIG. 8 depicts a portion of enclosure 100 when enclosure 100 is configured as a service entrance in an exemplary embodiment. In this embodiment, a bond jumper 802 electrically connects isolated neutral bus assembly 602 to grounding connector 702. In addition, L1 804 is coupled to a lower position of AC mains breaker 408, and L2 806 is coupled to the upper position of AC mains breaker 408, where L1 804 and L2 806 are supplied by the utility. As depicted in FIG. 8, the output of AC mains breaker 408 is wired to AC SPD 410, and the output of AC SPD 410 is wired to power converter section 404 (not shown in FIG. 8). Further, a ground wire 808 is connected to grounding connector 702. A neutral conductor 810 provided by the utility is attached to the now-grounded isolated neutral bus assembly 602.

Referring again to FIG. 7, if, for example, enclosure 100 is not configured as a service entrance, L1, L2 wiring from the customer is connected to AC mains breaker 408, and a neutral wire from the customer is electrically connected to isolated neutral bus assembly 602. In this case, a bond jumper is not connected from isolated neutral bus assembly 602 to grounding connector 702. Typically, the customer's neutral conductor is terminated at an external service entrance.

Figure 9:
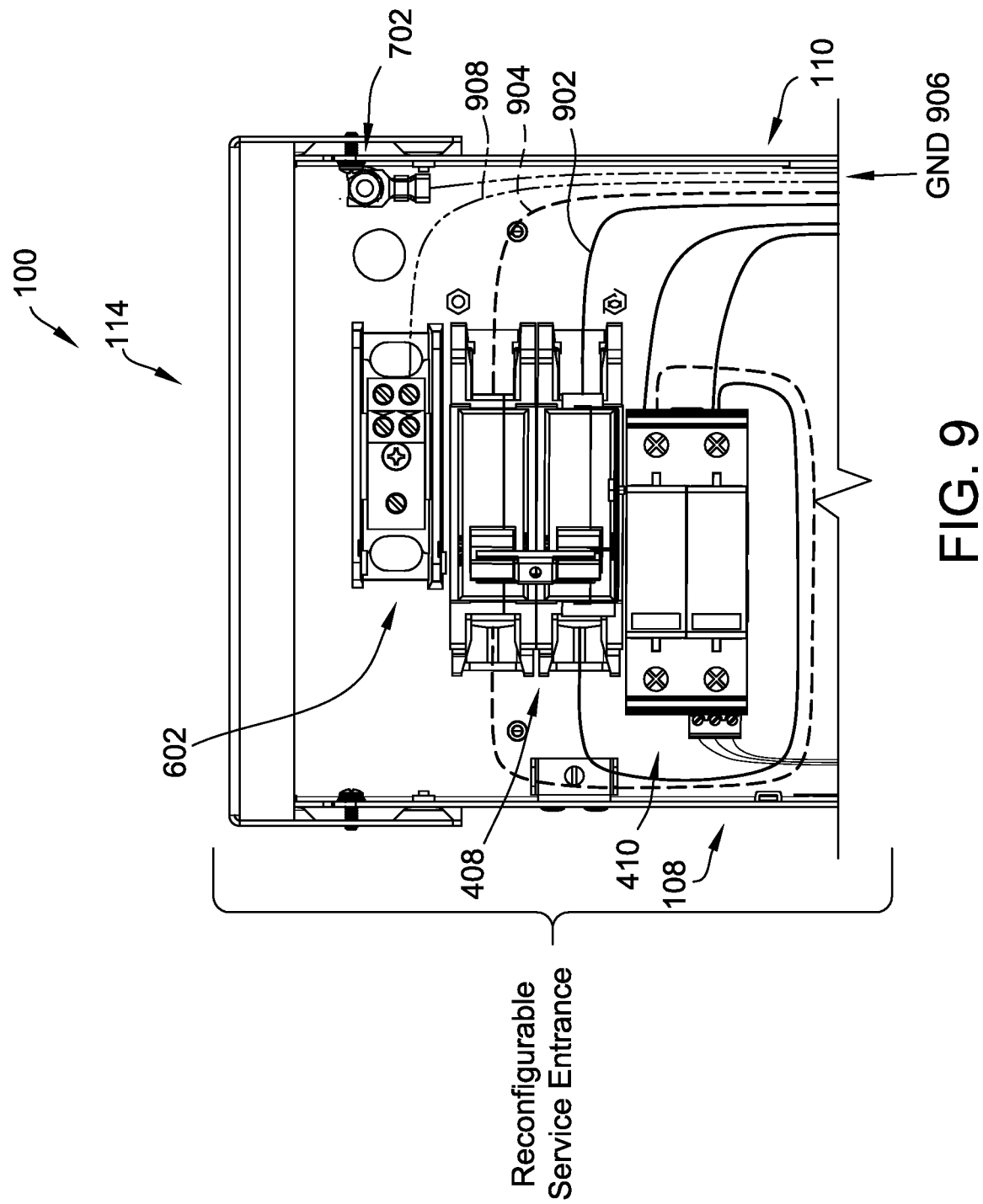
FIG. 9 depicts a portion of the enclosure of FIG. 7 when the enclosure is not configured as a service entrance in an exemplary embodiment.

FIG. 9 depicts a portion of enclosure 100 when enclosure 100 is not configured as a service entrance in an exemplary embodiment. In this embodiment, bond jumper 802 (see FIG. 8) is not present, and therefore, isolated neutral bus assembly 602 is ungrounded. In addition, L1 902 is coupled to the lower position of AC mains breaker 408, and L2 904 is coupled to the upper position of AC mains breaker 408, similar to FIG. 8 with the exception that L1 902 and L2 904 are supplied by the customer. As depicted in FIG. 9, the output of AC mains breaker 408 is wired to AC SPD 410, and the output of AC SPD 410 is wired to power converter section 404 (not shown in FIG. 9). Further, a ground wire 906 is connected to grounding connector 702, similar to FIG. 8. A neutral conductor 908 provided by the customer is attached to the un-grounded isolated neutral bus assembly 602.

Referring again to FIG. 7, enclosure 100 in this embodiment further comprises an AC raceway 706, which extends at side portion 110 of enclosure 100 from bottom portion 116 to top portion 114 of enclosure 100. AC raceway 706 guides AC wires (e.g., L1, L2, and neutral, not shown) from AC input section 136 to AC mains breaker 408, which isolates the AC wires from both power converter section 404 and DC distribution section 406 of enclosure 100. In addition, AC raceway 706 includes one or more cable tie points 708 that secure the AC wires in place within AC raceway 706.

Figure 10:
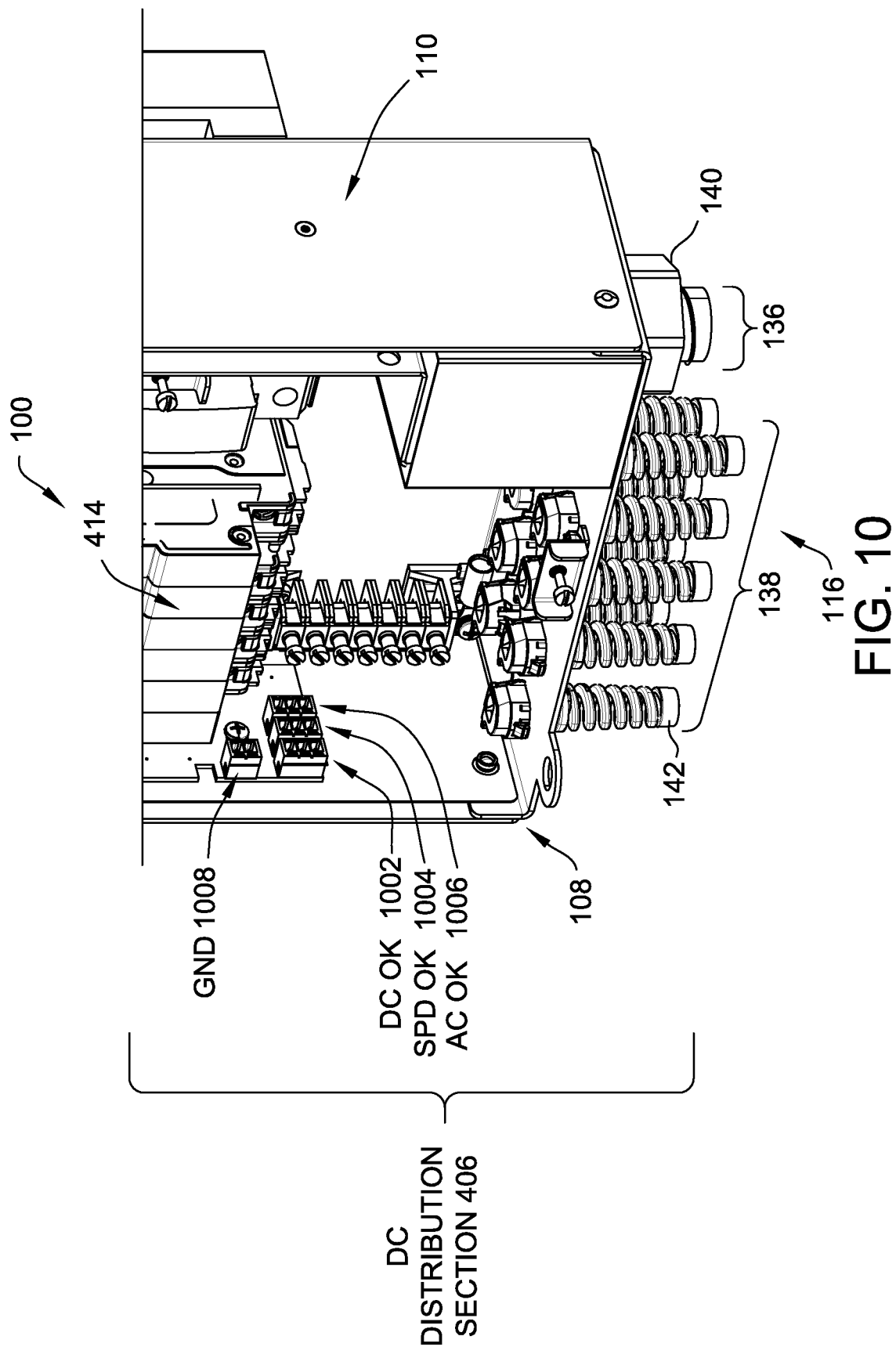
FIG. 10 depicts a portion of the enclosure of FIG. 7 in another exemplary embodiment.

As discussed briefly above, enclosure 100 in some embodiments includes customer alarms. FIG. 10 depicts a portion of enclosure 100 in an exemplary embodiment. In this embodiment, DC distribution section 406 includes pluggable terminal blocks 1002, 1004, 1006, 1008. When an alarm condition occurs at enclosure 100, one or more contactors close, which completes an electrical circuit associated with an alarm condition. In this embodiment, pluggable terminal blocks 1002, 1004, 1006, 1008 include a DC alarm block 1002, an SPD alarm block 1004, an AC alarm block 1006, and a ground block 1008. DC alarm block 1002 is associated with the DC output generated by DC distribution section 406 (e.g., an alarm may be generated when the DC output is incorrect or missing). SPD alarm block 1004 is associated with AC SPD 410 and DC SPD 412, and may be generated in response to one or more of AC SPD 410 and DC SPD 412 activating in response to a power surge. AC alarm block 1006 is associated with AC output of AC mains breaker 408, and may be generated in response to a loss of AC power supplied to enclosure 100. Ground block 1008 provides a ground path for the alarm circuits associated with DC alarm block 1002, SPD alarm block 1004, and AC alarm block 1006. In other embodiments, enclosure 100 includes more or fewer alarms, different configurations of pluggable terminal blocks 1002, 1004, 1006, 1008, etc.

Figure 11:
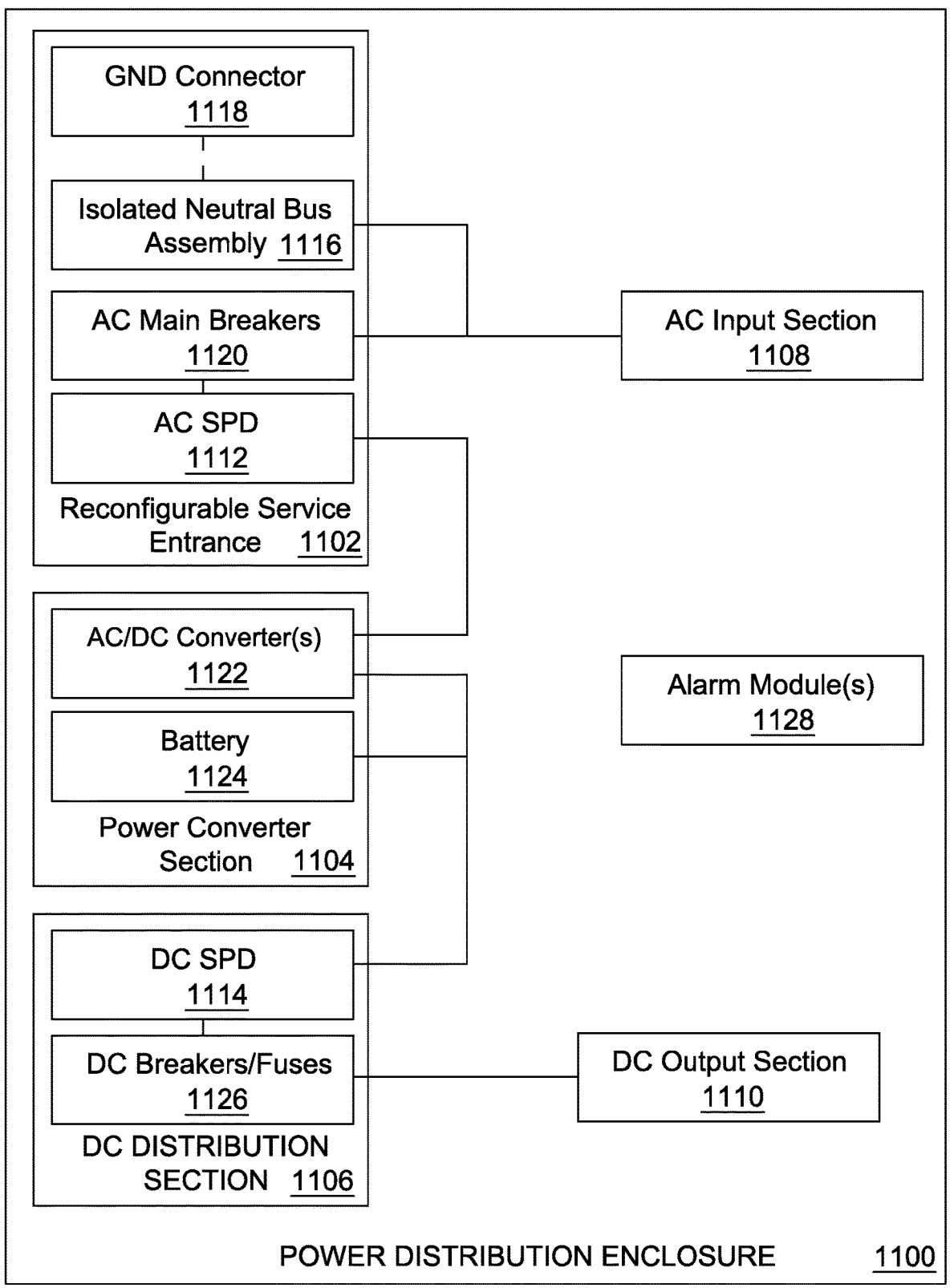
FIG. 11 depicts a block diagram of a power distribution enclosure in another exemplary embodiment.

FIG. 11 depicts a block diagram of a power distribution enclosure 1100 in another exemplary embodiment. In this embodiment, enclosure 1100 includes a reconfigurable service entrance 1102, a power converter section 1104, and a DC distribution section 1106. Reconfigurable service entrance 1102 comprises any component, system, or device which enables enclosure 100 to be selectively configured as a service entrance. Power converter section 1104 comprises any component, system, or device which provides power conversion (e.g., AC to DC power conversion) for enclosure 1100. DC distribution section 1106 comprises any component, system, or device which distributes DC power supplied by power converter section 1104.

In this embodiment, main AC power is supplied to enclosure 1100 via an AC input section 1108, and DC power is output from enclosure 1100 via a DC output section 1110. In this embodiment, enclosure 1100 includes AC SPD 1112 coupled to AC input section 1108, and a DC SPD 1114 coupled to DC output section 1110. AC SPD 1112 comprises any component, system, or device which protects enclosure 1100 from AC transients that may be coupled to enclosure 1100 at AC input section 1108 (e.g., overvoltage transients due, for example, to a lightning strike), and DC SPD 1114 comprises any component, system, or device that protects the customer's equipment from DC transients that maybe coupled to enclosure 1100 at DC output section 1110 (e.g., overvoltage transients due, for example, to a failure of a power converter of power converter section 1104).

In this embodiment, reconfigurable service entrance 1102 is configurable as a service entrance, similar to enclosure 100, described previously. Reconfigurable service entrance 1102 in this embodiment comprises an isolated neutral bus assembly 1116 which may be selectively coupled to a ground connector 1118. Ground connector 1118 is electrically coupled to a metal shell of enclosure 1100. Reconfigurable service entrance 1102 further includes an AC mains breaker 1120, which comprises any component, system, or device that provides the main AC breaker for AC power supplied to enclosure 1100 by AC input section 1108. The output of AC mains breaker 1120 is fed to AC SPD 1112, which then feeds one or more AC/DC converters 1122 within power converter section 1104. AC/DC converters 1122 comprise any component, system, or device that converts the AC supplied by AC mains breaker 1120 into DC power.

In some embodiments, power converter section 1104 includes one or more batteries 1124 (e.g., lead acid batteries, lithium-ion batteries, lithium iron phosphate batteries, super capacitors, or other storage technologies, etc.), which store energy and may be used to temporarily supply DC power to DC output section 1110 of enclosure 1100 when the AC power supplied to enclosure 1100 is lost. Batteries 1124 may also be referred to herein as one or more power storage devices. The output of AC/DC converters 1122 is supplied to DC SPD 1114, which then feeds one or more DC breakers (or fuses) 1126 within DC distribution section 1106 of enclosure 1100. DC breakers (or fuses) 1126 comprise any component, system, or device that selectively trips when the DC current supplied by DC distribution section 1106 exceeds a threshold current. The output of DC breakers (or fuses) 1126 is supplied to DC output section 1110, which provides the DC power to the customer's equipment.

In some embodiments, enclosure 1100 includes one or more alarm modules 1128, which may be used to indicate various conditions at enclosure 1100. In one embodiment, alarm modules 1128 generate an alarm when AC power supplied to enclosure 1100 is lost. In another embodiment, alarm modules 1128 generate an alarm when various components of enclosure 1100 are removed, such as dead front panel(s) that isolate the technician from AC wiring within enclosure 1100. In other embodiments, alarm modules 1128 generate an alarm when AC SPD 1112 and/or DC SPD 1114 activate, when DC power provided by DC distribution section 1106 is out of specification, etc.

Figure 12:
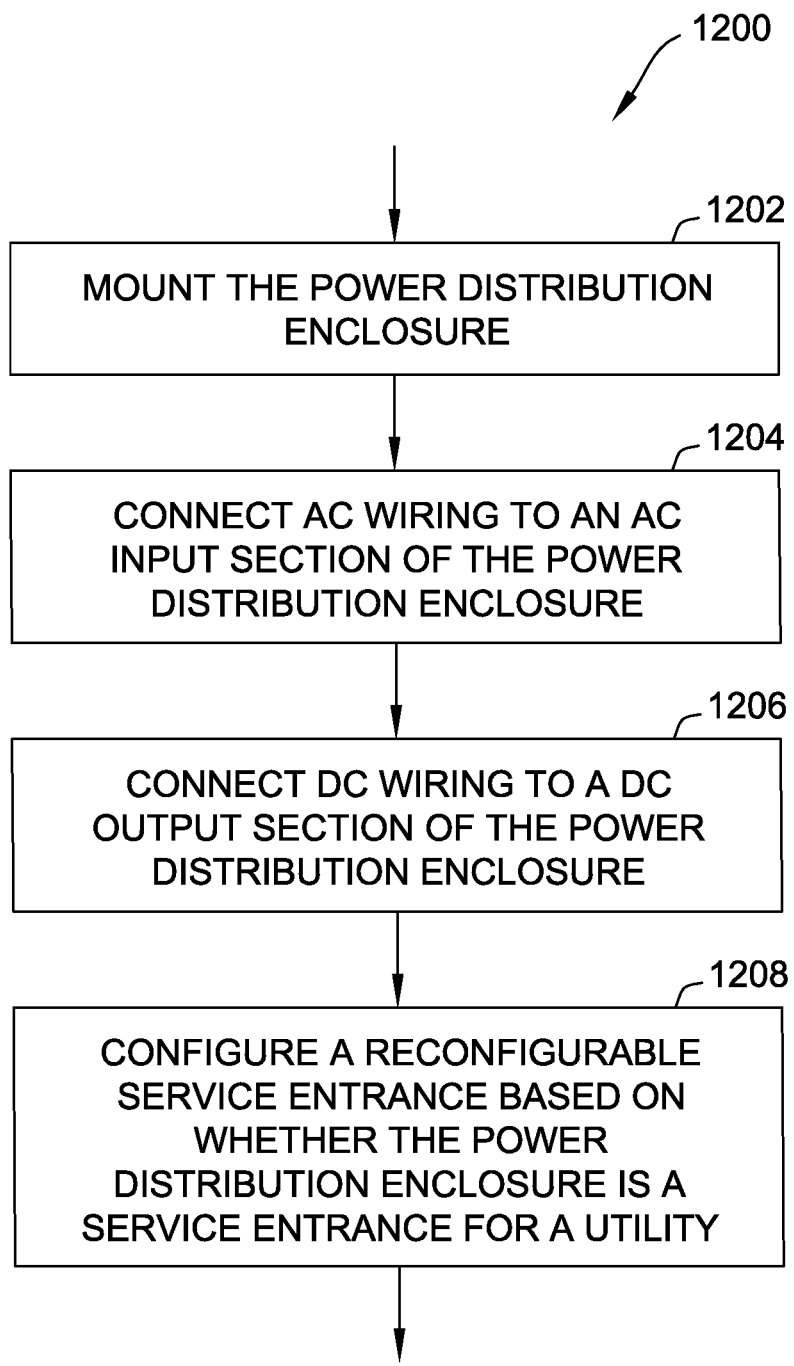
FIG. 12 is a flow chart of a method of installing a power distribution enclosure to supply DC power to a customer in an exemplary embodiment.

FIG. 12 is a flow chart of a method 1200 of installing a power distribution enclosure to supply DC power to a customer in an exemplary embodiment. Method 1200 begins by mounting the power distribution enclosure (1202). For example, enclosure 100, 1100 may be mounted to utility pole 202 or some other surface, such as a wall.

Method 1200 continues by connecting AC wiring to an AC input section of the power distribution enclosure, where the AC input section is electrically coupled to a reconfigurable service entrance (1204). For instance, AC wiring is connected to AC input sections 136, 1108 of enclosures 100, 1100, respectively.

Method 1200 continues by connecting DC wiring to a DC output section of the power distribution enclosure, where the DC wiring supplies the DC power to the customer via a power converter section of the power distribution enclosure that converts AC power supplied to the AC input section to the DC power (1206). For instance, DC wiring is coupled to DC output sections 138, 1110 of enclosures 100, 1100, respectively.

Method 1200 continues by configuring the reconfigurable service entrance based on whether the power distribution enclosure is a service entrance for a utility (1208). For example, by configuring reconfigurable service entrance 402, 1102 of enclosures 100, 1100, respectively, as previously described.

In one embodiment, the reconfigurable service entrance further comprises a ground connector electrically coupled to the power distribution enclosure, an isolated neutral bus assembly electrically isolated from the power distribution enclosure, and an AC mains breaker electrically coupled to the AC input section. In this embodiment, configuring the reconfigurable service entrance further comprises electrically bonding the isolated neutral bus assembly to the ground connector, and connecting the AC wiring further comprises connecting the AC wiring to the utility. For instance, referring to FIG. 8, bond jumper 802 is connected between isolated neutral bus assembly 602 and ground connector 702. Further, L1 804, L2 806, and neutral conductor 810 are supplied by the utility. Referring to FIG. 11, for instance, a bond jumper is connected between isolated neutral bus assembly 1116 and ground connector 1118. L1, L2, and neutral conductors are supplied by the utility, with L1, L2 coupled to AC mains breaker 1120 and the neutral conductor coupled to isolated neutral bus assembly 1116.

In another embodiment, configuring the reconfigurable service entrance further comprises electrically isolating the isolated neutral bus assembly from the ground connector, and connecting the AC wiring further comprises connecting the AC wiring to customer wiring. For instance, referring to FIG. 9, bond jumper 802 is not connected between isolated neutral bus assembly 602 and ground connector 702. Further, L1 902, L2 904, and neutral conductor 908 are supplied by the customer. Referring to FIG. 11, for instance, a bond jumper is not connected between isolated neutral bus assembly 1116 and ground connector 1118. L1, L2, and neutral conductors are supplied by the customer, with L1, L2 coupled to AC mains breaker 1120 and the neutral conductor coupled to isolated neutral bus assembly 1116.

The apparatus and method described herein provide for a power distribution enclosure that includes an AC input section, a DC output section, a reconfigurable service entrance, a power converter section, and a DC distribution section, within a common enclosure. The common enclosure saves space for the installation location and also, reduces the complexity of utilizing separate enclosures for both an AC service entrance and a rectifier, thereby providing technical benefits in the art.

An example technical effect of the apparatus and method described herein includes one or more of: (a) providing an enclosure that combines both a reconfigurable service entrance and a power converter section for customer equipment, thereby reducing the number of enclosures mounted to a service location; (b) reducing the rental cost for space on a utility pole for a customer; (c) reducing the number of AC breakers in the system; (d) providing alarms that signal various conditions at the enclosure; and (e) allowing the various components of the enclosure to be serviced in the field without removing the enclosure from the service location.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A power distribution enclosure configured to supply direct current (DC) power to a customer, the power distribution enclosure comprising:
   an alternating current (AC) input section configured to receive AC power;
   a DC output section configured to distribute the DC power to the customer;
   a reconfigurable service entrance electrically coupled to the AC input section;
   a power converter section electrically coupled to the AC input section and configured to receive the AC power from the reconfigurable service entrance, and to generate the DC power;
   a DC distribution section electrically coupled to the power converter section and configured to receive the DC power from the power converter section, and to distribute the DC power to the DC output section;
   a mounting portion disposed along a rear face of the power distribution enclosure, wherein the mounting portion includes fins configured to dissipate heat generated within the power converter section, and wherein the fins are formed in a shape corresponding to a partial circumference of a utility pole; and
   mounting features formed from a gap between the mounting portion and the rear face of the power distribution enclosure, wherein the mounting features are configured to receive one or more straps that secure the power distribution enclosure to the utility pole, with the fins proximate to the utility pole.

2. The power distribution enclosure of claim 1, wherein the reconfigurable service entrance further comprises:
   a ground connector electrically coupled to the power distribution enclosure;
   an isolated neutral bus assembly electrically isolated from the power distribution enclosure, wherein the reconfigurable service entrance comprises a service entrance when the isolated neutral bus assembly is bonded to the ground connector; and
   an AC mains breaker electrically coupled to the AC input section and the power converter section.

3. The power distribution enclosure of claim 2, wherein:
   the isolated neutral bus assembly is electrically bonded to the ground connector to configure the reconfigurable service entrance as the service entrance, and
   the AC input section is electrically coupled to utility wiring.

4. The power distribution enclosure of claim 2, wherein:
   the isolated neutral bus assembly is electrically isolated from the ground connector, and
   the AC input section is electrically coupled to customer wiring.

5. The power distribution enclosure of claim 1, wherein the power converter section further comprises:
   at least one AC/DC converter electrically coupled between the reconfigurable service entrance and the DC distribution section, wherein the at least one AC/DC converter is configured to receive the AC power from the reconfigurable service entrance, and to generate the DC power.

6. The power distribution enclosure of claim 5, wherein the power converter section further comprises:
   at least one power storage device configured to generate the DC power in response to a loss of the AC power supplied to the AC input section.

7. The power distribution enclosure of claim 1, wherein the DC distribution section further comprises:

at least one of a DC breaker and a DC fuse configured to receive the DC power from the power converter section, and to distribute the DC power to the DC output section.

8. The power distribution enclosure of claim 1, further comprising:
   at least one AC surge protector electrically coupled to the AC input section; and
   at least one DC surge protector electrically coupled to the DC output section.

9. The power distribution enclosure of claim 8, further comprising:
   an alarm module configured to generate an alert in response to one or more alarm conditions detected at the power distribution enclosure.

10. The power distribution enclosure of claim 9, wherein:
    the one or more alarm conditions comprises at least one of a removal of a protective panel on the power distribution enclosure, a loss of the AC power supplied to the AC input section, a loss of the DC power supplied by the DC output section, activation of the at least one AC surge protector, and activation of the at least one DC surge protector.

11. A method of installing a power distribution enclosure to supply direct current (DC) power to a customer, wherein:
    the power distribution enclosure comprises:
       a mounting portion disposed along a rear face of the power distribution enclosure, wherein the mounting portion includes fins configured to dissipate heat generated within the power distribution enclosure, and wherein the fins are formed in a shape corresponding to a partial circumference of a utility pole; and
       mounting features formed from a gap between the mounting portion and the rear face of the power distribution enclosure, wherein the mounting features are configured to receive one or more straps that secure the power distribution enclosure to the utility pole, with the fins proximate to the utility pole; and
    the method comprising:
       mounting the power distribution enclosure to the utility pole utilizing the one or more straps;
       connecting alternating current (AC) wiring to an AC input section of the power distribution enclosure, wherein the AC input section is electrically coupled to a reconfigurable service entrance of the power distribution enclosure;
       connecting DC wiring to a DC output section of the power distribution enclosure, wherein the DC wiring supplies the DC power to the customer via a power converter section of the power distribution enclosure that converts AC power supplied to the AC input section to the DC power; and
       configuring the reconfigurable service entrance based on whether the power distribution enclosure is a service entrance for a utility.

12. The method of claim 11, wherein:
    the reconfigurable service entrance further comprises:
       a ground connector electrically coupled to the power distribution enclosure;
       an isolated neutral bus assembly electrically isolated from the power distribution enclosure; and
       an AC mains breaker electrically coupled to the AC input section,
       wherein configuring the reconfigurable service entrance further comprises:
          electrically bonding the isolated neutral bus assembly to the ground connector, and
       wherein connecting the AC wiring further comprises:
          connecting the AC wiring to utility wiring.

13. The method of claim 11, wherein:
    the reconfigurable service entrance further comprises:
       a ground connector electrically coupled to the power distribution enclosure;
       an isolated neutral bus assembly electrically isolated from the power distribution enclosure; and
       an AC mains breaker electrically coupled to the AC input section,
       wherein configuring the reconfigurable service entrance further comprises:
          electrically isolating the isolated neutral bus assembly from the ground connector, and
       wherein connecting the AC wiring further comprises:
          connecting the AC wiring to customer wiring.

14. A power distribution enclosure configured to supply direct current (DC) power to a customer, the power distribution enclosure comprising:
    an alternating current (AC) input section configured to receive AC power;
    a DC output section configured to distribute the DC power to the customer;
    a reconfigurable service entrance that is electrically coupled to the AC input section, the reconfigurable service entrance comprising:
       a ground connector electrically coupled to the power distribution enclosure;
       an isolated neutral bus assembly electrically isolated from the power distribution enclosure, wherein the reconfigurable service entrance comprises a service entrance when the isolated neutral bus assembly is bonded to the ground connector; and
       an AC mains breaker electrically coupled to the AC input section; and
    a power converter section electrically coupled to the AC mains breaker and configured to receive the AC power, and to generate the DC power;
    a DC distribution section electrically coupled to the power converter section and configured to receive the DC power from the power converter section, and to distribute the DC power to the DC output section;
    a mounting portion disposed along a rear face of the power distribution enclosure, wherein the mounting portion includes fins configured to dissipate heat generated within the power converter section, and wherein the fins are formed in a shape corresponding to a partial circumference of a utility pole; and
    mounting features formed from a gap between the mounting portion and the rear face of the power distribution enclosure, wherein the mounting features are configured to receive one or more straps that secure the power distribution enclosure to the utility pole, with the fins proximate to the utility pole.

15. The power distribution enclosure of claim 14, wherein:
    the isolated neutral bus assembly is electrically bonded to the ground connector to configure the reconfigurable service entrance as the service entrance, and
    the AC input section is electrically coupled to utility wiring.

16. The power distribution enclosure of claim 15, wherein:
    the isolated neutral bus assembly is electrically isolated from the ground connector, and the AC input section is electrically coupled to customer wiring.

17. The power distribution enclosure of claim 14, wherein the DC distribution section further comprises:
at least one of a DC breaker and a DC fuse configured to receive the DC power from the power converter section, and to distribute the DC power to the DC output section.

18. The power distribution enclosure of claim 17, wherein the power converter section further comprises:
at least one AC/DC converter electrically coupled to the AC mains breaker and the at least one DC breaker and DC fuse, the at least one AC/DC converter configured to convert the AC power to the DC power.

19. The power distribution enclosure of claim 18, wherein the power converter section further comprises:
at least one power storage device configured to generate the DC power in response to a loss of the AC power supplied to the at least one AC/DC converter.

20. The power distribution enclosure of claim 14, further comprising:
at least one AC surge protector electrically coupled to the AC input section; and
at least one DC surge protector electrically coupled to the DC output section.

* * * * *